United States Patent
Zou et al.

(10) Patent No.: US 9,603,278 B1
(45) Date of Patent: Mar. 21, 2017

(54) SERVER CASING AND PLATE CONNECTING STRUCTURE THEREOF

(71) Applicant: Wistron Corporation, New Taipei (TW)

(72) Inventors: Zhi-Peng Zou, New Taipei (TW); Zhong-hui Mao, New Taipei (TW); Zi-Wei He, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 15/183,816

(22) Filed: Jun. 16, 2016

(30) Foreign Application Priority Data

Jan. 13, 2016 (CN) .......................... 2016 1 0024549

(51) Int. Cl.
| | |
|---|---|
| *G06F 1/16* | (2006.01) |
| *H05K 7/14* | (2006.01) |
| *H05K 7/18* | (2006.01) |
| *H05K 5/02* | (2006.01) |
| *H05K 5/00* | (2006.01) |

(52) U.S. Cl.
CPC ......... *H05K 7/1487* (2013.01); *H05K 5/0004* (2013.01); *H05K 5/0217* (2013.01); *H05K 7/18* (2013.01)

(58) Field of Classification Search
CPC ...... H05K 5/04; H05K 5/0004; H05K 5/0217; H05K 7/18; H05K 7/1487; A47B 88/90; A47B 88/941; G06F 1/181
USPC .... 312/223.2, 348.2, 265.5; 361/679.02, 724
See application file for complete search history.

(56) References Cited

U.S. PATENT DOCUMENTS

| | | | | |
|---|---|---|---|---|
| 5,372,269 A | * | 12/1994 | Sutton ...................... | B65D 3/04 220/4.09 |
| 5,645,332 A | * | 7/1997 | Snoke ................ | A47B 47/0075 220/690 |
| 5,735,411 A | * | 4/1998 | Flamme ................... | H02B 1/30 108/180 |
| 5,971,507 A | * | 10/1999 | Peroni .................. | H05K 7/1425 211/26 |
| 6,367,896 B1 | * | 4/2002 | Peng ....................... | G06F 1/181 292/80 |
| 2006/0076410 A1 | * | 4/2006 | Ko ..................... | H01R 13/6599 235/441 |

* cited by examiner

Primary Examiner — James O Hansen
(74) Attorney, Agent, or Firm — Winston Hsu; Scott Margo (57) ABSTRACT

A server casing includes a frame having first and second plates and a plate connecting structure including first and second side boards extending from the first and second plates respectively and having first and second opening structures and first and second riveting structures respectively. A first outer periphery of the first opening structure is larger than a first inner periphery, and a first limiting surface extends therebetween. A second outer periphery of the second opening structure is less than a second inner periphery, and a second limiting surface extends therebetween. The first and second riveting structures have third and fourth limiting surfaces respectively. When the second riveting structure is engaged with the second opening structure and the second and fourth limiting surfaces abuts against each other, the first riveting structure is pressed to engage with the first opening structure and the first and third limiting surfaces abuts against each other.

16 Claims, 7 Drawing Sheets

SERVER CASING AND PLATE CONNECTING STRUCTURE THEREOF

BACKGROUND OF THE INVENTION

1. Field of the Invention

The present invention relates to a server casing and a plate connecting structure thereof, and more specifically, to a server casing for riveting a riveting structure of a second side board to an opening structure of a first side board to fix the first side board to the second side board and a plate connecting structure thereof.

2. Description of the Prior Art

In general, a server casing usually utilizes side boards of an upper plate and a lower plate to form side board structures located at two sides of the server casing. A conventional plate connecting design is to rivet a board edge of one side board to a board edge of another side board stacked on the board edge of the one side board for fixing the two side boards. However, in this design, since the stacked board edges riveted to each other additionally occupies partial internal containing space of the server casing, it would influence efficiency of the server casing in use of the internal containing space, so as to decrease the allowed amount of the disk drive which the server casing could contain and cause waste of space.

SUMMARY OF THE INVENTION

The present invention provides a server casing including a frame and at least one plate connecting structure. The frame has a first plate and a second plate. The at least one plate connecting structure includes a first side board and a second side board. The first side board extends from the first plate and has a first opening structure and a second opening structure extending toward the second plate. The first opening structure has a first outer periphery located on an outer surface of the first side board and a first inner periphery located on an inner surface of the first side board. The first outer periphery is larger than the first inner periphery. At least one first limiting surface extends from the first outer periphery to the first inner periphery. The second opening structure has a second outer periphery located on the outer surface of the first side board and a second inner periphery located on the inner surface of the first side board. The second outer periphery is less than the second inner periphery. At least one second limiting surface extends from the second outer periphery to the second inner periphery. The second side board extends from the second plate and has a first riveting structure and a second riveting structure extending toward the first plate. The first riveting structure has a third limiting surface corresponding to the at least one first limiting surface. The second riveting structure has a fourth limiting surface corresponding to the at least one second limiting surface. When the second riveting structure is engaged with the second opening structure and the at least one second limiting surface abuts against the fourth limiting surface, the first riveting structure is pressed to engage with the first opening structure and the at least one first limiting surface abuts against the third limiting surface for connecting the first side board to the second side board.

The present invention further provides a plate connecting structure for forming a side board structure of a server casing. The plate connecting structure includes a first side board and a second side board. The first side board has a first opening structure and a second opening structure. The first opening structure has a first outer periphery located on an outer surface of the first side board and a first inner periphery located on an inner surface of the first side board. The first outer periphery is larger than the first inner periphery. At least one first limiting surface extends from the first outer periphery to the first inner periphery. The second opening structure has a second outer periphery located on the outer surface of the first side board and a second inner periphery located on the inner surface of the first side board. The second outer periphery is less than the second inner periphery. At least one second limiting surface extends from the second outer periphery to the second inner periphery. The second side board has a first riveting structure and a second riveting structure. The first riveting structure has a third limiting surface corresponding to the at least one first limiting surface. The second riveting structure has a fourth limiting surface corresponding to the at least one second limiting surface. When the second riveting structure is engaged with the second opening structure and the at least one second limiting surface abuts against the fourth limiting surface, the first riveting structure is pressed to engage with the first opening structure and the at least one first limiting surface abuts against the third limiting surface for connecting the first side board to the second side board to form the side board structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
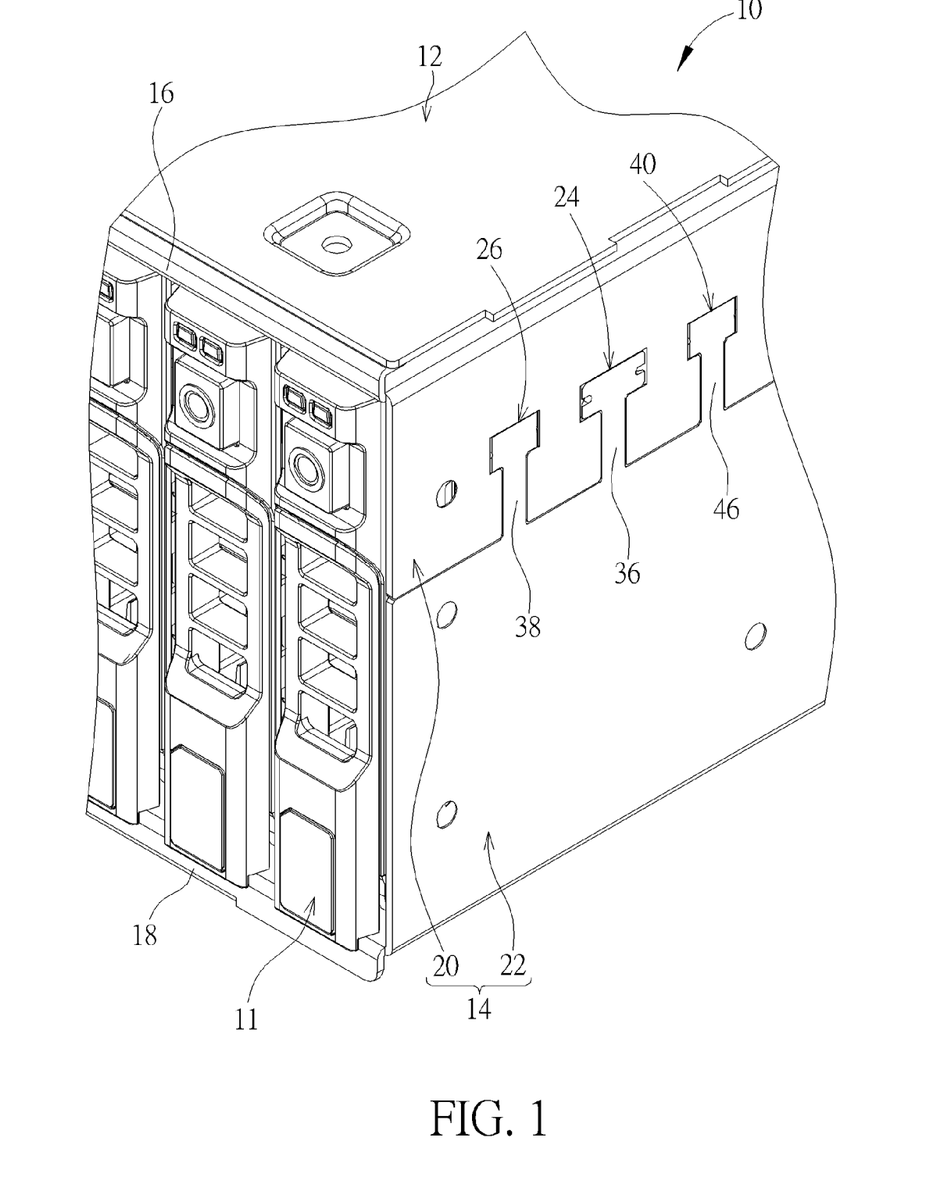
FIG. 1 is a partial diagram of a server casing according to an embodiment of the present invention.

Please refer to FIG. 1, which is a partial diagram of a server casing 10 according to an embodiment of the present invention. The server casing 10 could be used for containing a plurality of disk drives 11 (e.g. 2.5" hard disk drive) to perform data transfer and storage of a server. As shown in FIG. 1, the server casing 10 includes a frame 12 and at least one plate connecting structure 14 (one shown in FIG. 1, but not limited thereto). The frame 12 has a first plate 16 and a second plate 18. The frame 12 could adopt a conventional server casing design (e.g. a frame composed of an upper plate, a lower plate, and two side boards), and the related description is omitted herein since it is commonly seen in the prior art. The plate connecting structure 14 is used for connecting the first plate 16 to the second plate 18 to form a side board structure of the server casing 10. The plate connecting structure 14 includes a first side board 20 and a second side board 22.

Figure 2:
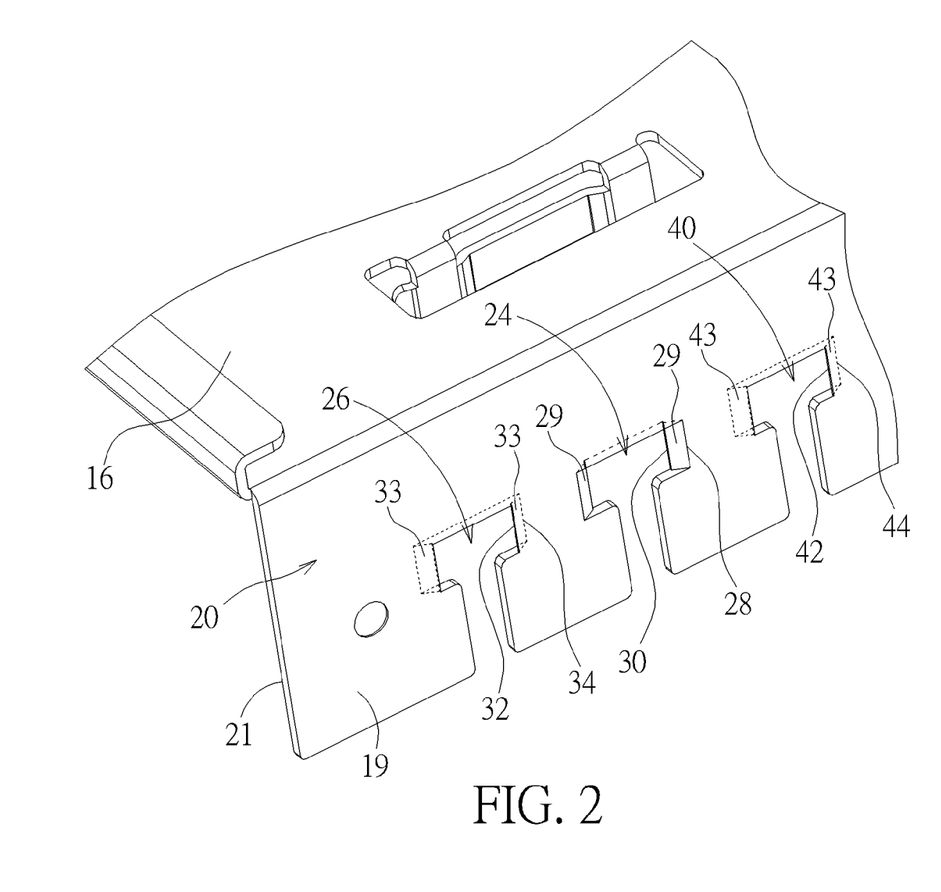
FIG. 2 is a partial enlarged diagram of a first side board in FIG. 1.
Figure 3:
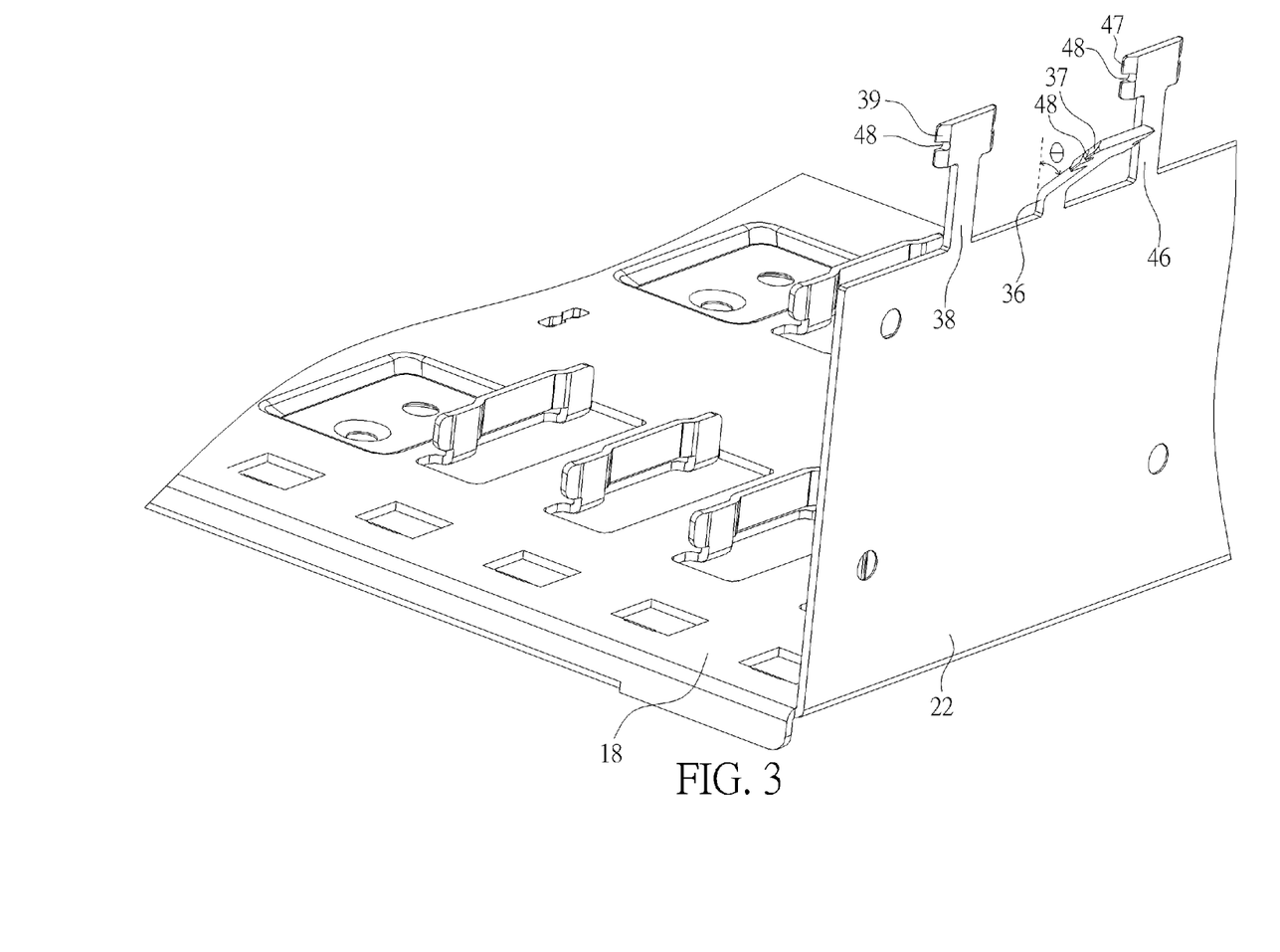
FIG. 3 is a partial enlarged diagram of a second side board in FIG. 1.

More detailed description for the structural design of the plate connecting structure 14 is provided as follows. Please refer to FIG. 1, FIG. 2, and FIG. 3. FIG. 2 is a partial enlarged diagram of the first side board 20 in FIG. 1. FIG. 3 is a partial enlarged diagram of the second side board 22 in FIG. 1. As shown in FIG. 1, FIG. 2, and FIG. 3, the first side board 20 extends from the first plate 16. The first side board 20 has a first opening structure 24 and a second opening structure 26 extending toward the second plate 18, but not limited thereto, meaning that amount of the first opening structure 24 and the second opening structure 26 could vary with the practical application of the plate connecting structure 14. The first opening structure 24 has a first outer periphery 28 located on an outer surface 19 of the first side board 20 and a first inner periphery 30 located on an inner surface 21 of the first side board 20. The first outer periphery 28 is larger than the first inner periphery 30. At least one first limiting surface 29 (two shown in FIG. 2, but not limited thereto) extends from the first outer periphery 28 to the first inner periphery 30. The second opening structure 26 has a second outer periphery 32 located on the outer surface 19 and a second inner periphery 34 located on the inner surface 21. The second outer periphery 32 is less than the second inner periphery 34. At least one second limiting surface 33 (two shown in FIG. 2, but not limited thereto) extends from the second outer periphery 32 to the second inner periphery 34.

To be more specific, in this embodiment, an area of the first outer periphery 28 is larger than an area of the first inner periphery 30, and an area of the second outer periphery 32 is larger than an area of the second inner periphery 34. That is, the first opening structure 24 could preferably be an opening structure which is wider outside and narrower inside, and the second opening structure 26 could preferably be an opening structure which is narrower outside and wider inside. The first limiting surface 29 and the second limiting surface 33 could be preferably an inclined surface, but not limited thereto, meaning that the first limiting surface 29 and the second limiting surface 33 could adopt other guide surface design, such as a curved surface. The second side board 22 extends from the second plate 18. The second side board 22 has a first riveting structure 36 and a second riveting structure 38, but not limited thereto. The first riveting structure 36 has a third limiting surface 37 corresponding to the first limiting surface 29, and the second riveting structure 38 has a fourth limiting surface 39 corresponding to the second limiting surface 33. In this embodiment, the first opening structure 24 and the second opening structure 26 could be preferably a hollow T-shaped structure, and the first riveting structure 36 and the second riveting structure 38 could be preferably a T-shaped pillar for engaging with the first opening structure 24 and the second opening structure 26 respectively, but not limited thereto. That is, the present invention could adopt other structural engagement design. For example, in another embodiment, the first opening structure 24 and the second opening structure 26 could be a hollow round-head pillar, and the first riveting structure 36 and the second riveting structure 38 could be a round-head pillar for engaging with the first opening structure 24 and the second opening structure 26 respectively. As for other derived embodiments (e.g. the first opening structure 24 and the second opening structure 26 could be a hollow trapezoid-head pillar and the first riveting structure 36 and the second riveting structure 38 could be a trapezoid-head pillar), the related description could be reasoned by analogy according to the aforesaid description and omitted herein.

Furthermore, as shown in FIG. 2 and FIG. 3, the first side board 20 could further have a third opening structure 40 (one shown in FIG. 2, but not limited thereto). In this embodiment, the first opening structure 24 is located between the second opening structure 26 and the third opening structure 40. The third opening structure 40 has a third outer periphery 42 located on the outer surface 19 and a third inner periphery 44 located on the inner surface 21. The third outer periphery 42 is less than the third inner periphery 44. At least one fifth limiting surface 43 (two shown in FIG. 2, but not limited thereto) extends from the third outer periphery 42 to the third inner periphery 44. That is, the third opening structure 40 could have the similar structure with the second opening structure 26 (i.e. an opening structure which is narrower outside and wider inside). The fifth limiting surface 43 could be preferably an inclined surface, but not limited thereto, meaning that the fifth limiting surface 43 could adopt other guide surface design, such as a curved surface. The second side board 22 could further have at least one third riveting structure 46 (one shown in FIG. 2, but not limited thereto). The third riveting structure 46 has a sixth limiting surface 47 corresponding to the fifth limiting surface 43.

In practical application, for preventing flash of the first riveting structure 36 during the riveting process (it may cause a flash structure with a considerable thickness formed on a position where the first riveting structure 36 is engaged with the first opening structure 24 so as to occupy the internal containing space of the frame 12), as shown in FIG. 3, at least one flash groove 48 (one shown in FIG. 3, but not limited thereto) is formed on the third limiting surface 37, but not limited thereto. For example, in another embodiment, the flash groove 48 could be formed on the first limiting surface 29. Accordingly, the flash groove 48 could contain the deformed portion of the first riveting structure 36 during the first side structure 20 is riveted to the second side structure 22. To be noted, the flash groove 48 could also be formed on the other limiting surfaces, such as the fourth limiting surface 39 and the sixth limiting surface 47 (as shown in FIG. 3), and the related description could be reasoned by analogy according to the aforesaid description and omitted herein.

Furthermore, for assembly convenience, in this embodiment, the second riveting structure 38 and the third riveting structure 46 could be coplanar with the second side board 22, and the first riveting structure 36 could bend outwardly relative to the second side board 22 at a bending angle θ (preferably 45°, but not limited thereto), so that the first riveting structure 36 could be aligned with the first opening structure 24 more quickly and precisely via engagement of the second riveting structure 38 and the second opening structure 26 and engagement of the third riveting structure 46 and the third opening structure 40. In such a manner, a user could complete the assembly process of the first side structure 20 and the second side structure 22 quickly.

Figure 4:
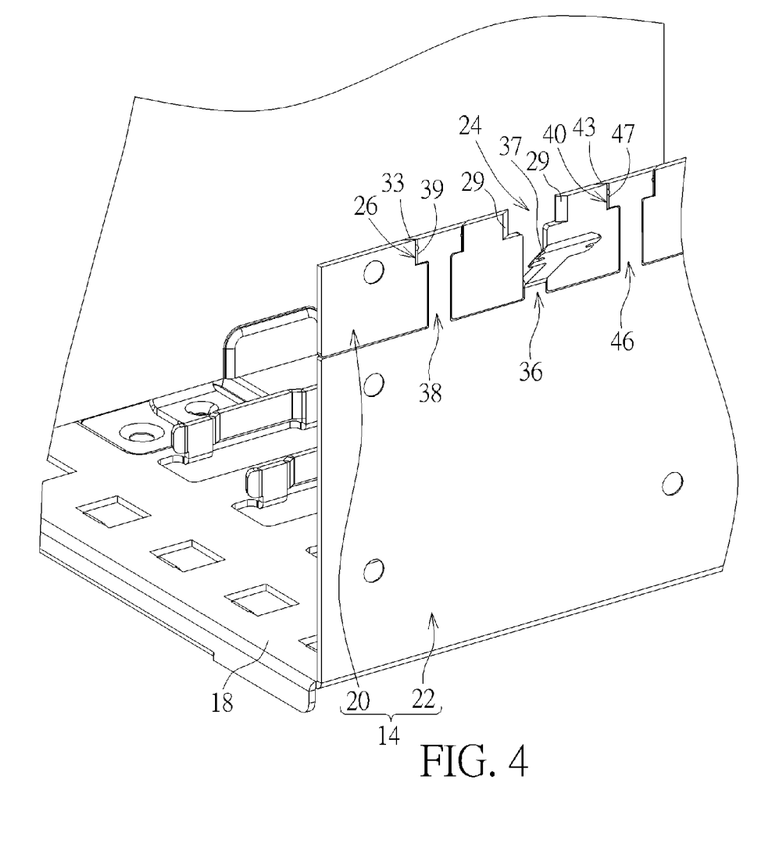
FIG. 4 is a partial cross sectional diagram of a second riveting structure and a third riveting structure in FIG. 3 being engaged with a second opening structure and a third opening structure respectively.

Via the aforesaid design, when a user wants to connect the first side board 20 to the second side board 22, the user just needs to press the second riveting structure 38 and the third riveting structure 46 into the second opening structure 26 and the third opening structure 40 respectively, to make the second riveting structure 38 and the third riveting structure 46 engaged with the second opening structure 26 and the third opening structure 40 respectively, so as to guide the first riveting structure 36 to be aligned with the first opening structure 24. At this time, as shown in FIG. 4, the second limiting surface 33 could abut against the fourth limiting surface 39 to make the second riveting structure 38 coplanar with the first side board 20 (but not limited thereto), and the fifth limiting surface 43 could abut against the sixth limiting surface 47 to make the second riveting structure 46 coplanar with the first side board 20 (but not limited thereto). Subsequently, the user could utilize a conventional riveting process (e.g. utilizing a punching head to perform a riveting process on the first side board 20 and the second side board 22) to press the first riveting structure 36 into the first opening structure 24, so as to make the first riveting structure 36 engaged with the first opening structure 24. At this time, as shown in FIG. 5, the first limiting surface 29 could abut against the third limiting surface 37 to make the second riveting structure 46 coplanar with the first side board 20 (but not limited thereto).

Figure 5:
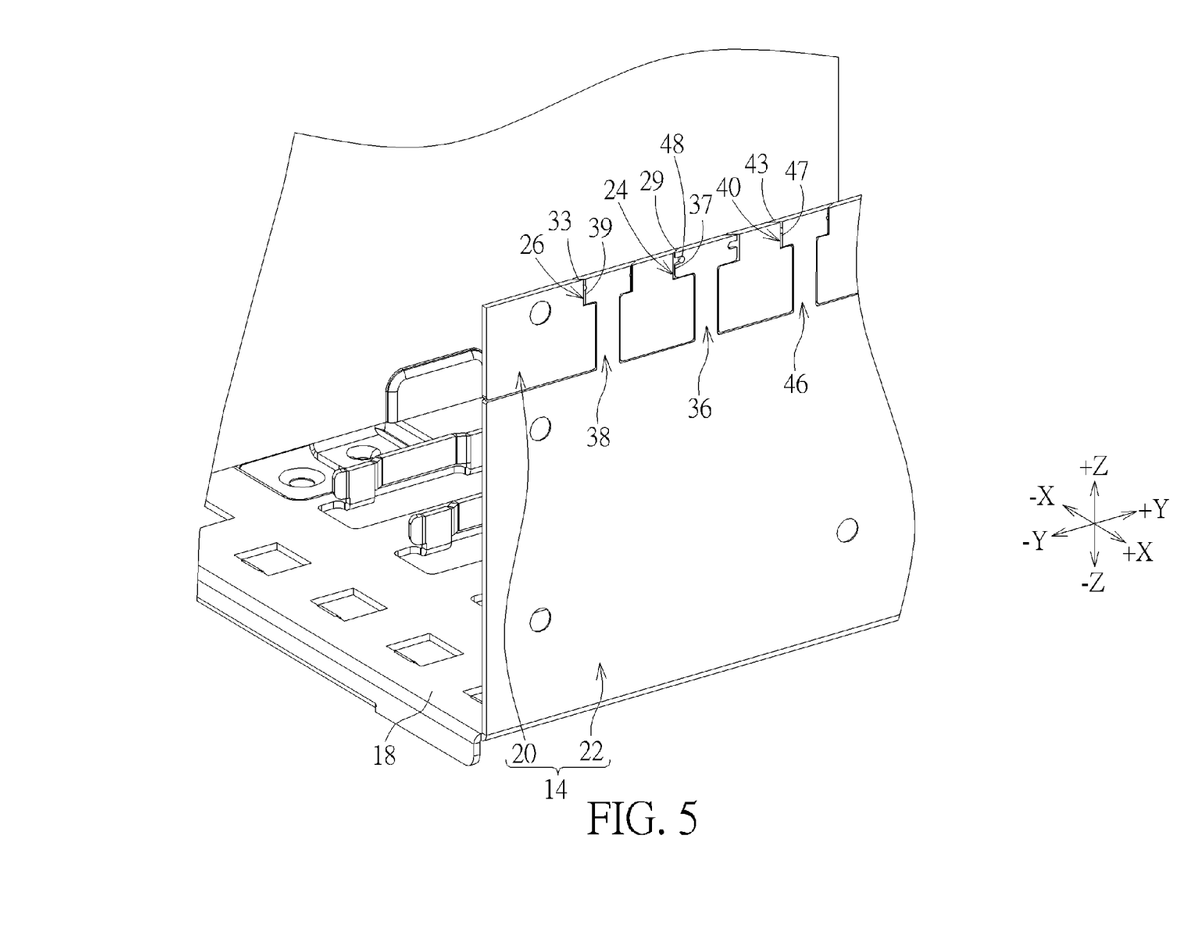
FIG. 5 is a partial cross sectional diagram of a first riveting structure in FIG. 4 being engaged with a first opening structure.

Accordingly, engagement of the first riveting structure 36 and the first opening structure 24, engagement of the second riveting structure 38 and the second opening structure 26, and engagement of the third riveting structure 46 and the third opening structure 40 could constrain movement of the first side board 20 toward ±Y-axis direction and ±Z-axis direction as shown in FIG. 5 relative to the second side board 22, abutting of the first limiting surface 29 against the third limiting surface 37 could constrain movement of the first side board 20 toward +X-axis direction as shown in FIG. 5, and abutting of the second limiting surface 33 against the fourth limiting surface 39 and abutting of the fifth limiting surface 43 against the sixth limiting surface 47 could constrain movement of the first side board 20 toward −X-axis direction as shown in FIG. 5. That is, via the aforesaid design in which the first side board 20 could be riveted to the second side board 22 through riveting of the first riveting structure 36 and the first opening structure 24, riveting of the second riveting structure 38 and the second opening structure 26, and riveting of the third riveting structure 46 and the third opening structure 40, the first side board 20 could be fixed to the second side board 22 steadily to form a side board structure of the frame 12 as shown in FIG. 5.

In such a manner, since the plate connecting structure provided by the present invention adopts the aforesaid design that the riveting structure is riveted to the opening structure without additionally occupying the internal containing space of the server casing, the present invention could maximize efficiency of the server casing in use of the internal containing space, so as to increase the allowed amount of the disk drive which the server casing could contain.

Figure 6:
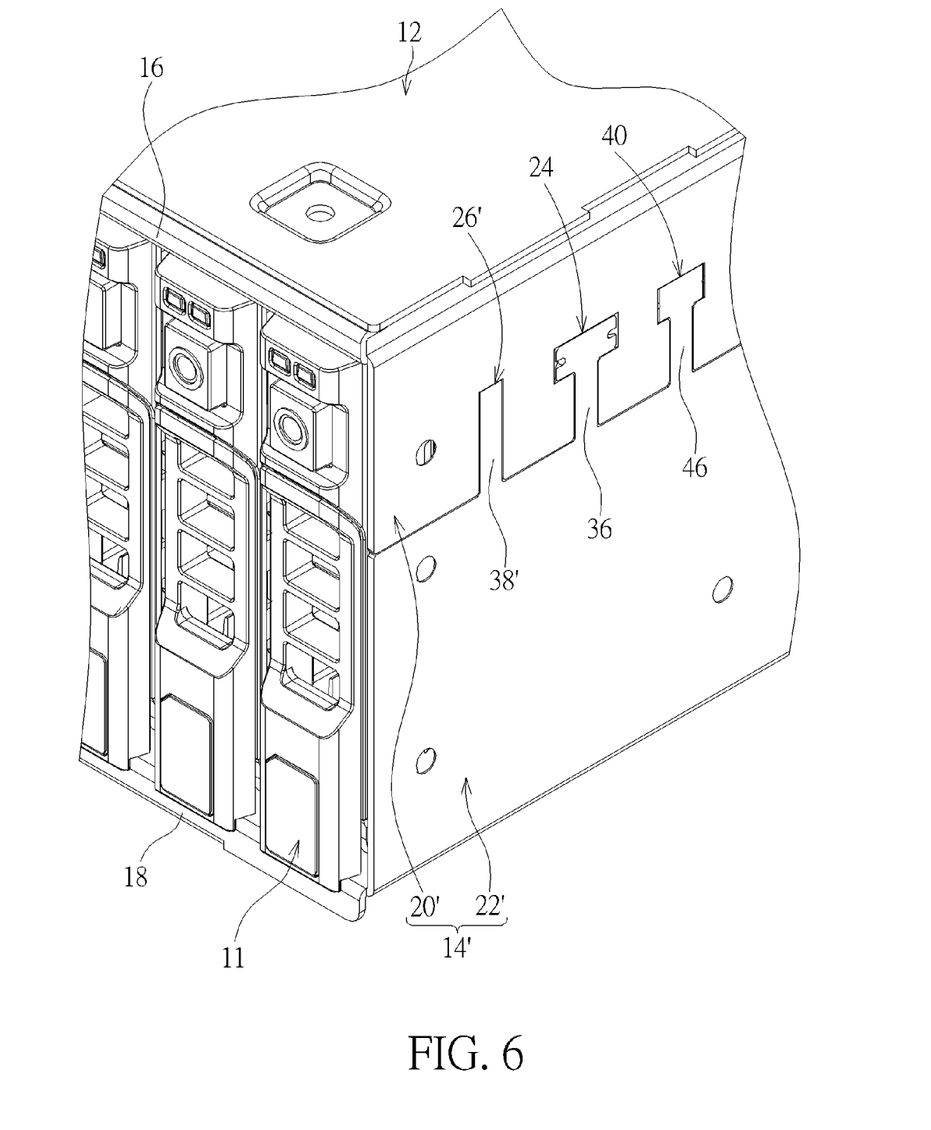
FIG. 6 is a partial enlarged diagram of a plate connecting structure according to another embodiment of the present invention.

It should be mentioned that the third riveting structure 46 and the third opening 40 could be omitted. For example, in another embodiment, the present invention could connect the first side board 20 to the second sideboard 22 only via riveting of the first riveting structure 36 and the first opening structure 24 and riveting of the second riveting structure 38 and the second opening structure 26 without the third riveting structure 46 and the third opening 40, so as to simplify the structural design of the plate connecting structure of the present invention. Furthermore, the structural designs of the riveting structure and the opening structure could be not limited to the aforesaid embodiment. For example, please refer to FIG. 6, which is a partial enlarged diagram of a plate connecting structure 14' according to another embodiment of the present invention. The major difference between this embodiment and the aforesaid embodiment is the structural designs of the second opening structure and the second riveting structure. Components both mentioned in this embodiment and the aforesaid embodiment represent components with similar structures or functions. As shown in FIG. 6, the plate connecting structure 14' includes a first side board 20' and a second side board 22'. The first side board 20' extends from the first plate 16 and has the first opening structure 24 extending toward the second plate 18, a second opening structure 26' and the third opening structure 40. The second side board 22' extends from the second plate 18 and has the first riveting structure 36, a second riveting structure 38' and the third riveting structure 46. In this embodiment, the first opening structure 24 and the third opening structure 40 could be a hollow T-shaped structure respectively, the second opening structure 26' could be a hollow vertical bar structure, the first riveting structure 36 and the third riveting structure 46 could be a T-shaped pillar respectively, and the second riveting structure 38' could be a vertical bar structure. Accordingly, the first side board 20' could be fixed to the second side board 22' steadily to form the side board structure of the frame 12 as shown in FIG. 6 via riveting of the first riveting structure 36 and the first opening structure 24, riveting of the second riveting structure 38' and the second opening structure 26' and riveting of the third riveting structure 46 and the third opening structure 40. As for other related description (e.g. the limiting surface design for the second riveting structure 38' and the second opening structure 26' and the related assembly process), it could be reasoned by analogy according to the aforesaid embodiment and omitted herein.

Figure 7:
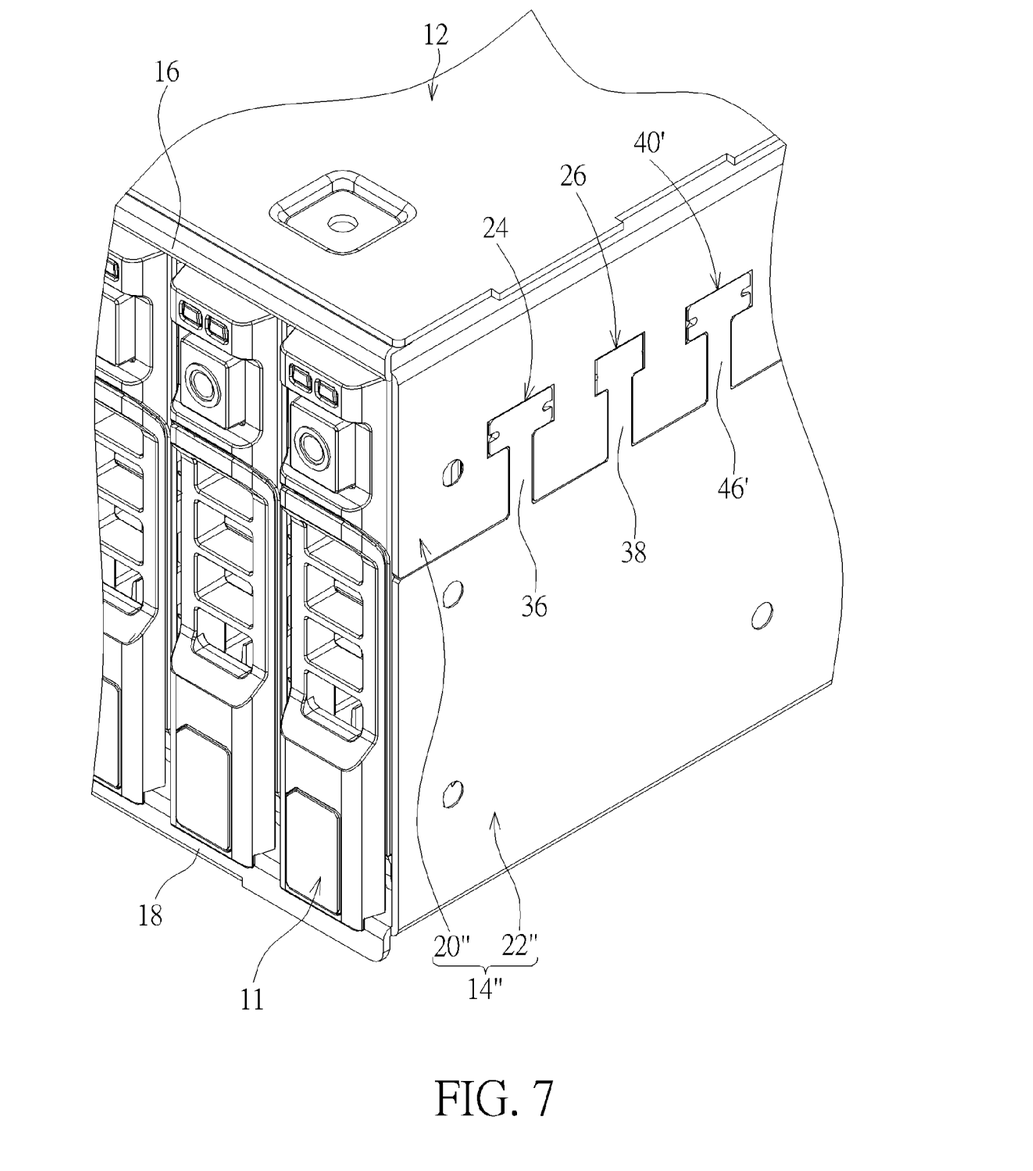
FIG. 7 is a partial enlarged diagram of a plate connecting structure according to another embodiment of the present invention.

Furthermore, configuration of the riveting structures and the opening structures is not limited to the aforesaid embodiments. For example, please refer to FIG. 7, which is a partial enlarged diagram of a plate connecting structure 14" according to another embodiment of the present invention. Components both mentioned in this embodiment and the aforesaid embodiments represent components with similar structures or functions. As shown in FIG. 7, the plate connecting structure 14" includes a first side board 20" and a second side board 22". The first side board 20" extends from the first plate 16 and has the first opening structure 24, the second opening structure 26, and a third opening structure 40'. The second side board 22" extends from the second plate 18 and has the first riveting structure 36, the second riveting structure 38 and a third riveting structure 46'. In this embodiment, the second opening structure 26 is located between the first opening structure 24 and the third opening structure 40'. The third opening structure 40' could have the similar structure with the first opening structure 24 (i.e. an opening structure which is wider outside and narrower inside). Accordingly, the first side board 20" could be fixed to the second side board 22" steadily to form the side board structure of the frame 12 as shown in FIG. 7 via riveting of the first riveting structure 36 and the first opening structure 24, riveting of the second riveting structure 38 and the second opening structure 26, riveting of the third riveting structure 46' and the third opening structure 40'. As for other related description (e.g. the limiting surface design for the third riveting structure 46' and the third opening structure 40' and the related assembly process), it could be reasoned by analogy according to the aforesaid embodiments and omitted herein.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A server casing comprising:
a frame having a first plate and a second plate; and
at least one plate connecting structure comprising:
a first side board extending from the first plate and having a first opening structure and a second opening structure extending toward the second plate, the first opening structure having a first outer periphery located on an outer surface of the first side board and a first inner periphery located on an inner surface of the first side board, the first outer periphery being larger than the first inner periphery, at least one first limiting surface extending from the first outer periphery to the first inner periphery, the second opening structure having a second outer periphery located on the outer surface of the first side board and a second inner periphery located on the inner surface of the first side board, the second outer periphery being less than the second inner periphery, at least one second limiting surface extending from the second outer periphery to the second inner periphery; and
a second side board extending from the second plate and having a first riveting structure and a second riveting structure extending toward the first plate, the first riveting structure having a third limiting surface corresponding to the at least one first limiting surface, the second riveting structure having a fourth limiting surface corresponding to the at least one second limiting surface, and when the second riveting structure is engaged with the second opening structure and the at least one second limiting surface abuts against the fourth limiting surface, the first riveting structure being pressed to engage with the first opening structure and the at least one first limiting surface abutting against the third limiting surface for connecting the first side board to the second side board.

2. The server casing of claim 1, wherein the at least one first limiting surface is symmetrical to the at least one second limiting surface, and the third limiting surface is symmetrical to the fourth limiting surface.

3. The server casing of claim 1, wherein the at least one first opening structure and the second opening structure are a hollow T-shape structure respectively, and the first riveting structure and the second riveting structure are a T-shaped pillar respectively.

4. The server casing of claim 1, wherein the first opening structure is a hollow T-shaped structure, the second opening structure is a hollow vertical bar structure, the first riveting structure is a T-shaped pillar, and the second riveting structure is a vertical bar structure.

5. The server casing of claim 1, wherein at least one flash groove is formed on the at least one first limiting surface or the third limiting surface.

6. The server casing of claim 1, wherein when the second riveting structure is engaged with the second opening structure and the at least one second limiting surface abuts against the fourth limiting surface to make the second riveting structure coplanar with the first side board, the first riveting structure is pressed to engage with first opening structure and the at least one first limiting surface abuts against the third limiting surface to make the first riveting structure coplanar with the first side board.

7. The server casing of claim 1, wherein the first side board further has a third opening structure, the first opening structure is located between the second opening structure and the third opening structure, the third opening structure has a third outer periphery located on the outer surface of the first side board and a third inner periphery located on the inner surface of the first side board, the third outer periphery is less than the third inner periphery, at least one fifth limiting surface extends from the third outer periphery to the third inner periphery, the second side board further has a third riveting structure, the third riveting structure has a sixth limiting surface corresponding to the at least one fifth limiting surface, and the third riveting structure is engaged with the third opening structure and the at least fifth limiting surface abuts against the sixth limiting surface, so as to connect the first side board to the second side board cooperatively with the first riveting structure and the second riveting structure.

8. The server casing of claim 1, wherein the first sideboard further has a third opening structure, the second opening structure is located between the first opening structure and the third opening structure, the third opening structure has a third outer periphery located on the outer surface of the first side board and a third inner periphery located on the inner surface of the first side board, the third outer periphery is larger than the third inner periphery, at least one fifth limiting surface extends from the third outer periphery to the third inner periphery, the second side board further has a third riveting structure, the third riveting structure has a sixth limiting surface corresponding to the at least one fifth limiting surface, and the third riveting structure is engaged with the third opening structure and the at least fifth limiting surface abuts against the sixth limiting surface, so as to connect the first side board to the second side board cooperatively with the first riveting structure and the second riveting structure.

9. A plate connecting structure for forming a side board structure of a server casing, the plate connecting structure comprising:
a first side board having a first opening structure and a second opening structure, the first opening structure having a first outer periphery located on an outer surface of the first side board and a first inner periphery located on an inner surface of the first side board, the first outer periphery being larger than the first inner periphery, at least one first limiting surface extending from the first outer periphery to the first inner periphery, the second opening structure having a second outer periphery located on the outer surface of the first side board and a second inner periphery located on the inner surface of the first side board, the second outer periphery being less than the second inner periphery, at least one second limiting surface extending from the second outer periphery to the second inner periphery; and
a second side board having a first riveting structure and a second riveting structure, the first riveting structure having a third limiting surface corresponding to the at least one first limiting surface, the second riveting structure having a fourth limiting surface corresponding to the at least one second limiting surface, and when the second riveting structure is engaged with the second opening structure and the at least one second limiting surface abuts against the fourth limiting surface, the first riveting structure being pressed to engage with the first opening structure and the at least one first limiting surface abutting against the third limiting surface for connecting the first sideboard to the second side board to form the side board structure.

10. The plate connecting structure of claim 9, wherein the at least one first limiting surface is symmetrical to the at least one second limiting surface, and the third limiting surface is symmetrical to the fourth limiting surface.

11. The plate connecting structure of claim 9, wherein the first opening structure and the second opening structure are a hollow T-shape structure respectively, and the first riveting structure and the second riveting structure are a T-shaped pillar respectively.

12. The plate connecting structure of claim 9, wherein the first opening structure is a hollow T-shaped structure, the second opening structure is a hollow vertical bar structure, the first riveting structure is a T-shaped pillar, and the second riveting structure is a vertical bar structure.

13. The plate connecting structure of claim 9, wherein at least one flash groove is formed on the at least one first limiting surface or the third limiting surface.

14. The plate connecting structure of claim 9, wherein when the second riveting structure is engaged with the second opening structure and the at least one second limiting surface abuts against the fourth limiting surface to make the second riveting structure coplanar with the first side board, the first riveting structure is pressed to engage with first opening structure and the at least one first limiting surface abuts against the third limiting surface to make the first riveting structure coplanar with the first side board.

15. The plate connecting structure of claim 9, wherein the first side board further has a third opening structure, the first opening structure is located between the second opening structure and the third opening structure, the third opening structure has a third outer periphery located on the outer surface of the first side board and a third inner periphery located on the inner surface of the first side board, the third outer periphery is less than the third inner periphery, at least one fifth limiting surface extends from the third outer periphery to the third inner periphery, the second side board further has a third riveting structure, the third riveting structure has a sixth limiting surface corresponding to the at least one fifth limiting surface, and the third riveting structure is engaged with the third opening structure and the at least fifth limiting surface abuts against the sixth limiting surface, so as to connect the first side board to the second side board cooperatively with the first riveting structure and the second riveting structure.

16. The plate connecting structure of claim 9, wherein the first side board further has a third opening structure, the second opening structure is located between the first opening structure and the third opening structure, the third opening structure has a third outer periphery located on the outer surface of the first side board and a third inner periphery located on the inner surface of the first side board, the third outer periphery is larger than the third inner periphery, at least one fifth limiting surface extends from the third outer periphery to the third inner periphery, the second side board further has a third riveting structure, the third riveting structure has a sixth limiting surface corresponding to the at least one fifth limiting surface, and the third riveting structure is engaged with the third opening structure and the at least fifth limiting surface abuts against the sixth limiting surface, so as to connect the first side board to the second side board cooperatively with the first riveting structure and the second riveting structure.

\* \* \* \* \*